(12) United States Patent
Moriyama

(10) Patent No.: US 6,413,884 B1
(45) Date of Patent: *Jul. 2, 2002

(54) METHOD OF PRODUCING THIN FILMS USING CURRENT OF PROCESS GAS AND INERT GAS COLLIDING WITH EACH OTHER

(75) Inventor: Tsuyoshi Moriyama, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/092,091

(22) Filed: Jun. 5, 1998

(30) Foreign Application Priority Data

Jun. 5, 1997 (JP) .............................. 9-148126

(51) Int. Cl.$^7$ .............................. H01L 21/31
(52) U.S. Cl. ...................... 438/784; 438/787
(58) Field of Search .............. 438/758, 782, 438/784, 787; 118/232, 255, 719, 725, 438, 699, 50.1

(56) References Cited

U.S. PATENT DOCUMENTS

| | | | |
|---|---|---|---|
| 3,660,179 A | 5/1972 | Desmond et al. | 148/189 |
| 4,499,853 A | 2/1985 | Miller | 118/725 |
| 4,745,088 A | 5/1988 | Inoue et al. | 437/102 |
| 5,015,330 A | * 5/1991 | Okumura et al. | 156/643 |
| 5,445,676 A | * 8/1995 | Takagi | 118/719 |
| 5,533,736 A | * 7/1996 | Yamaga | 277/3 |
| 5,637,153 A | * 6/1997 | Niino et al. | 134/22.11 |
| 5,829,939 A | * 11/1998 | Iwai et al. | 414/411 |
| 5,968,593 A | * 10/1999 | Sakamoto et al. | 427/248.1 |

FOREIGN PATENT DOCUMENTS

| | | |
|---|---|---|
| EP | 0 252 667 | 1/1988 |
| EP | 0 491 393 | 6/1992 |
| EP | 0 625 589 | 11/1994 |
| JP | 1-258416 | 10/1989 |
| JP | 3-255618 | 11/1991 |
| JP | 5-234906 | 9/1993 |
| JP | 6-188238 | 7/1994 |
| JP | 8-330237 | 12/1996 |

OTHER PUBLICATIONS

Inoue et al.; RF Induction–Heated Hot–Wall Type Reactor for High–Volume, Low–Cost Si Epitaxy; Electrochemical Technology; vol. 137 No. 4; Apr. 1990; pp. 1228–1234.

* cited by examiner

*Primary Examiner*—Trung Dang
*Assistant Examiner*—Brook Kebede
(74) *Attorney, Agent, or Firm*—Foley & Lardner

(57) ABSTRACT

The present invention provides a heat treatment apparatus capable of forming a uniform thin layer on the substrate provided with a furnace core pipe, a substrate supporting boat for supporting a lot of substrates disposed in the furnace core pipe and a process gas injector pipe having many blowing holes for spouting the process gas toward the substrate, the supporting boat having a rotation mechanism to rotate around the normal line passing through one principal face of the substrate as a rotation axis. In the apparatus, an inert gas injector pipe has the same number of inert gas or nitrogen gas blowing holes as the number of process gas blowing holes and is provided at an approximately symmetrical position relative to the center line of the rotation axis.

15 Claims, 5 Drawing Sheets

METHOD OF PRODUCING THIN FILMS USING CURRENT OF PROCESS GAS AND INERT GAS COLLIDING WITH EACH OTHER

BACKGROUND OF THE INVENTION

1. Field of the Invention

The present invention relates to a method of producing thin films and apparatus, such as, a heat treatment apparatus, for producing the same.

2. Description of the Related Art

A vertical type diffusion furnace has been used for forming diffusion layer films. The conventional vertical type diffusion furnace is provided, as main parts, with a furnace core cylinder, a substrate supporting boat, a process gas injector pipe having a lot of holes and disposed in the furnace core cylinder, a purge gas supply tube and a heat insulating cylinder. A lot of substrates can be mounted on the substrate supporting boat, which is provided with a mechanism to make the boat to rotate together with the heat insulating cylinder around a center axis or line of the heat insulating cylinder as a rotation axis.

In forming a diffusion layer film on the substrate by the use of this conventional vertical type furnace, a process gas is supplied from many blowing holes provided at the process gas injector pipe toward the center line of the rotation axis, so that the gas flow is made parallel to the surface of each substrate.

The process gas is supplied on the substrate from the process gas injector pipe and is spouted toward the center of the substrate by being spread perpendicular to the spouting direction of the process gas in the conventional vertical type diffusion furnace. Since the substrate is rotated by the boat rotating mechanism, a small amount of the process gas tends to be supplied at the peripheral area of the substrate while a large amount of the gas is supplied at the center of the substrate.

Accordingly, the thin film thus formed has the film thickness, which has a tendency to have a hill-like film thickness distribution in which the film thickness is gradually increased from the peripheral region to the center of the substrate with exhibiting a deficiency to become large at the center of the substrate.

SUMMARY OF THE INVENTION

Accordingly, it is an object of the present invention to provide a method for forming thin films capable of providing a uniform film thickness on the substrate.

It is another object of the present invention to provide an apparatus for practicing the method for forming the thin film described above.

According to one aspect of the present invention, there is provided a method of producing a thin film on a substrate disposed in a furnace core pipe, which comprises a step of making the substrate to rotate around a center axis in accompany with allowing a first gas to spout toward the substrate. The center axis is a normal line passing through the center of one principal face of the substrate. The first gas consists essentially of a process gas. In the method of the aspect of the present invention, the thin film is formed on the substrate while allowing a second gas to spout via the center axis in the colliding direction to the first gas. The second gas consists essentially of an inert gas or nitrogen gas.

It is preferable that the second gas spouts along a direction approximately opposite to the spout direction of the first gas.

It is more preferable that the locations for supplying the first gas and the second gas are approximately symmetrically positioned with each other with respect to the center axis. The first gas is simultaneously supplied with the second gas.

According to another aspect of the present invention, there is provided an apparatus for producing thin films, which comprises a furnace core pipe, a substrate supporting boat for supporting a lot of substrates disposed in the furnace core pipe, a first gas injector pipe having many first blowing holes for spouting the first gas comprising a process gas toward the substrate, the supporting boat having a rotation mechanism for allowing the boat to rotate using a normal line passing through the center of a principal face of the substrate as a rotation axis, and a second gas injector pipe having second blowing holes for spouting a second gas and being provided at an opposite position at which the second gas collides with the first gas on a surface of the substrate. The second gas consists essentially of an inert gas or nitrogen gas.

It is preferable that the first gas injector pipe is provided at an approximately symmetrical position against the second gas injection pipe relative to the center line of the rotation axis.

More preferably in the aspect of the present invention, the first and the second gas injector pipes makes a pair of pipes as a first pair of pipes. The apparatus further comprises another pair of pipes similar to the first pair of pipes as a second pair of pipes. Each of the second pair of pipes is provided in a different position from the first pair of pipes but has the same position relation relative to the center line as the first pair of pipes.

DESCRIPTION OF THE PREFERRED EMBODIMENT

For easy comprehension of the present invention, a conventional vertical type furnace and a method for forming a diffusion layer using the same will be described hereinafter with reference to FIGS. 1 and 2.

Figure 1:
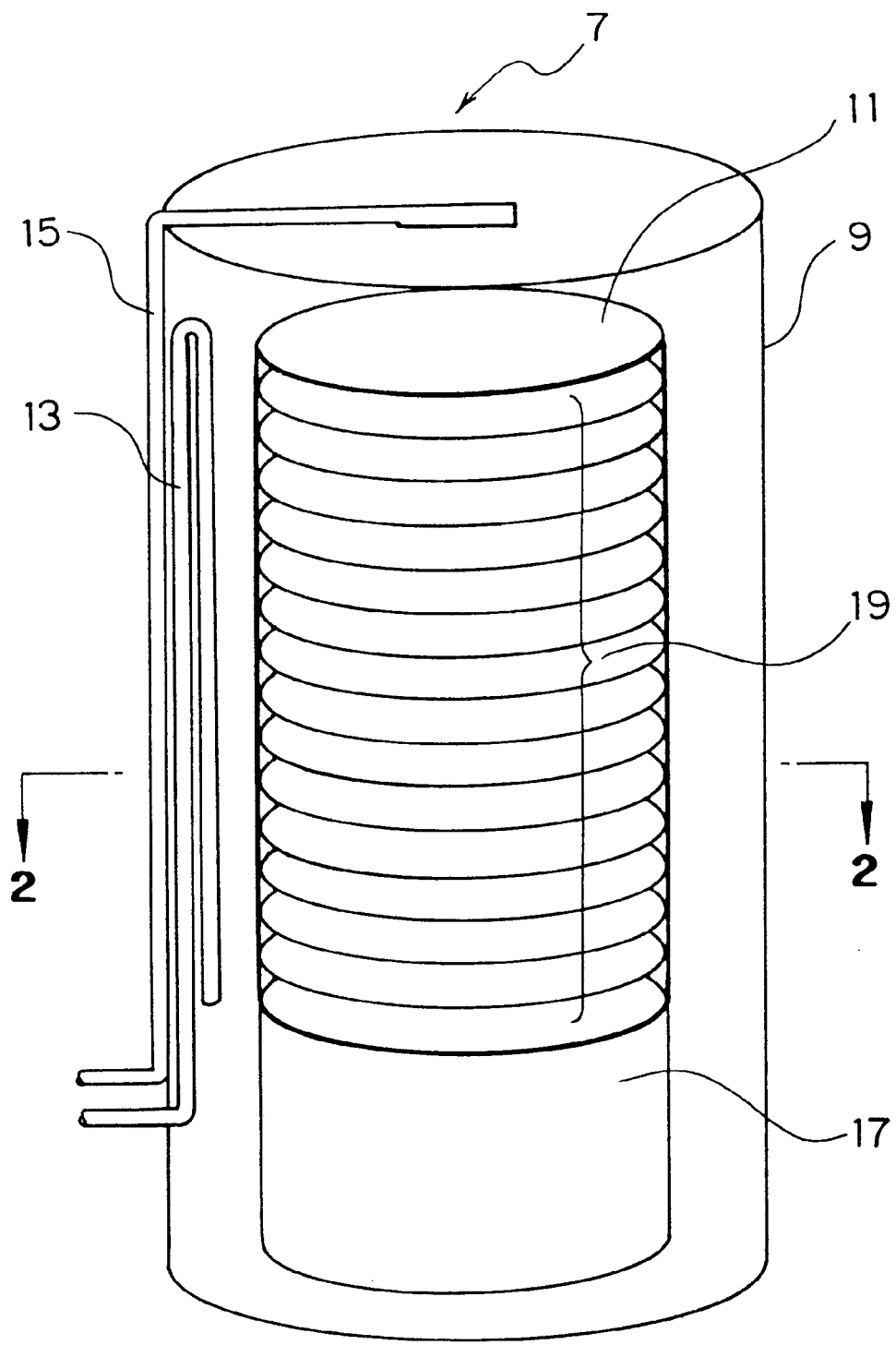
FIG. 1 is an illustrative view showing a vertical type diffusion furnace as a conventional apparatus for forming thin films.

Referring to FIG. 1, the major part of the diffusion furnace 7 is provided with a core furnace pipe 9 forming an outer core. A substrate supporting boat 11 is disposed on the center axis of the core furnace pipe 9. A process gas injector pipe 13 has a lot of holes and is disposed around the substrate supporting boat 11 in the core furnace pipe 9. A purge gas supply pipe 15 is also disposed for heating an atmosphere in the core furnace pipe and keeping the atmosphere at a constant temperature at the periphery of the core furnace pipe 9. A heat-insulating cylinder 17 is disposed at the bottom of the substrate supporting boat 11. A plurality of substrates 19 can be placed with a given space left therebetween on the substrate supporting boat 11. A rotation mechanism (not shown) is for allowing the substrates to rotate around the center axis of the heat-insulating cylinder 17 together with the heat-insulating cylinder 17 and is provided for the substrate supporting boat 11.

The process gas injector pipe 13 penetrates into the furnace through the bottom of the core furnace pipe 9, and is elongated to the bottom of the furnace by making a U-turn after being elongated to the top of the furnace along the inner wall of the core furnace pipe 9. The process gas injector pipe 13 has many blowing holes not shown in the figure. These blowing holes are disposed so as to supply the process gas in parallel relation to the surface of the substrate 19 along with supplying the process gas toward the center line of the rotation axis. A diffusion layer film is formed on the substrate 19 with the gas supplied from these blowing holes.

Figure 2:
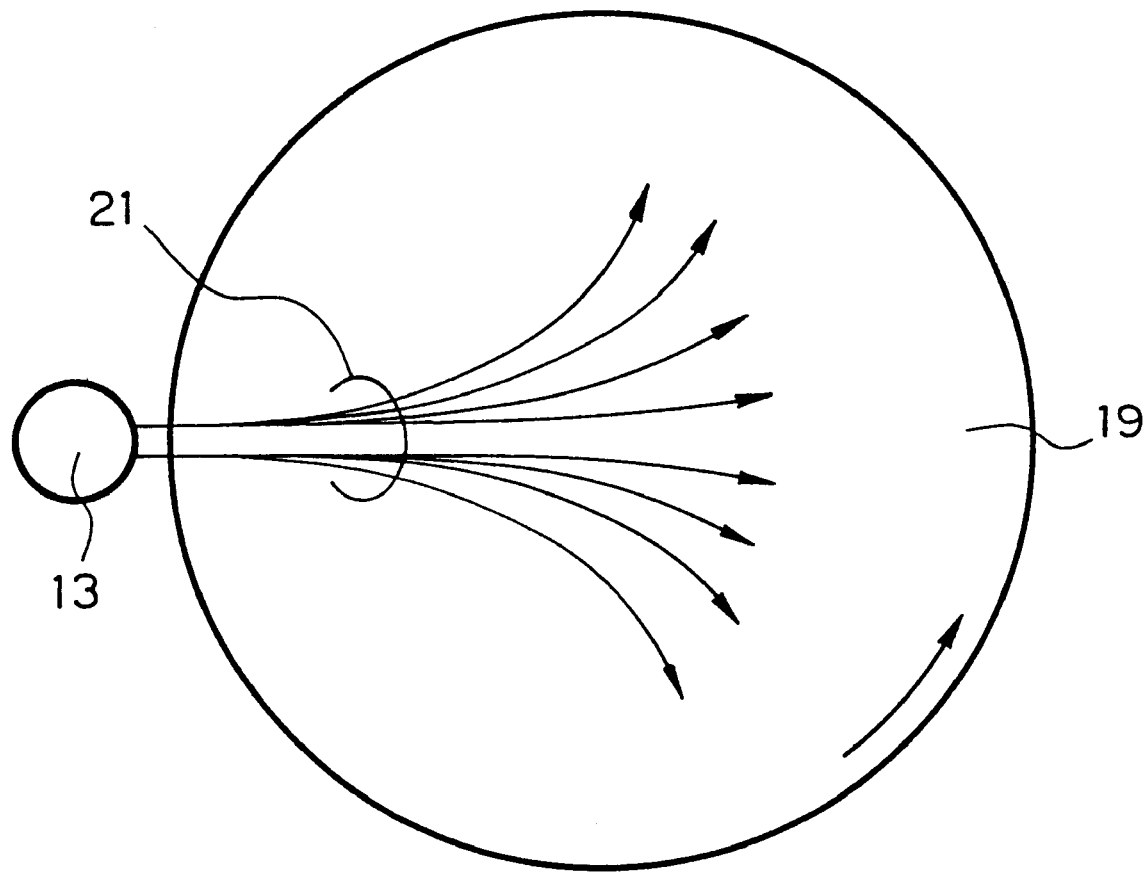
FIG. 2 is a cross sectional view taken along the line 2—2 in FIG. 1.

Referring to FIG. 2 corresponding to the cross section 2—2 in FIG. 1, a process gas is supplied on the substrate 19 by means of the process gas injector pipe 13. The process gas is spouted toward the center of substrate 19 by being spread perpendicular to the spouting direction of the process gas. Because the substrate 19 is rotating by the boat rotation mechanism, relatively a small amount of the process gas is liable to be supplied at the periphery of the substrate 19 while a large amount of the process gas is supplied at the center of substrate 19. Accordingly, the film thickness of the thin film thus formed has a tendency to have a hill-like film thickness distribution in which the film thickness is gradually increased from the peripheral region to the center of the substrate 19.

By considering the problems as hitherto described, the preferred embodiment according to the present invention will be described hereinafter with reference to FIGS. 3 to 5. The parts having the same names as in the examples shown in FIG. 1 and FIG. 2 are expressed by the same reference numerals in FIG. 3 to FIG. 5.

Figure 3:
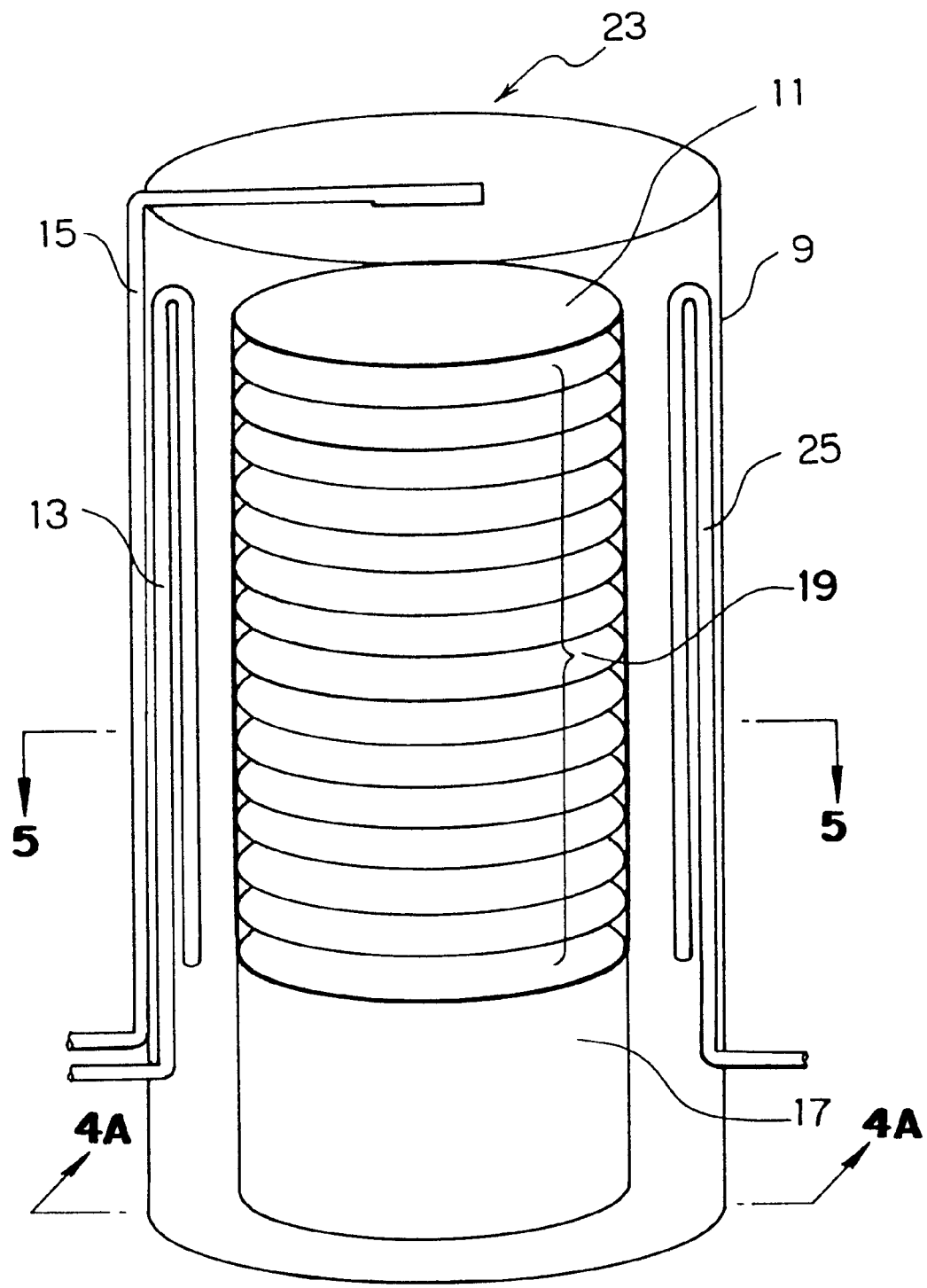
FIG. 3 is an illustrative view showing the constitution of an apparatus for forming thin films in the example according to the present invention.

Referring to FIG. 3, a constitution of the major part of the vertical type diffusion furnace 23 constitutes an apparatus for forming thin films. The apparatus is provided with a furnace core pipe 9, a substrate supporting boat 11 supporting the substrates, a process gas injector 13, a purge gas supply pipe 15 and a heat-insulation cylinder 17 for mounting the substrate supporting boat 11. In the apparatus, the supporting boat has a rotation mechanism (not shown in the figure) to make the substrates to rotate together with the heat-insulation cylinder 17. Its rotation axis is directed along the normal line passing through the center of the substrate 19. These components have the same construction as in the conventional examples.

The apparatus for forming thin films according to the present invention differs from the conventional one in that the former has an inert gas injector pipe 25. Referring to FIG. 4A, the inert gas injector pipe 25 is provided at an approximately symmetrical position against the process gas injector pipe 13 relative to the center line of the rotation axis. In the similar manner to the process gas injector pipe 13, this inert gas injector pipe 25 penetrates into the furnace core pipe 9 from its bottom and makes a U-turn to be elongated to the bottom after being elongated to the top along the inner wall of the furnace core pipe 9. These two injector pipes 13 and 25 have the same construction with each other. The inert injector pipe 25 and the process gas injector pipe 13 may be provided in any different position on a concentric circle with a center as a center line, in which position the inert gas and the process gas will collide with each other on the substrate.

Figure 4C:
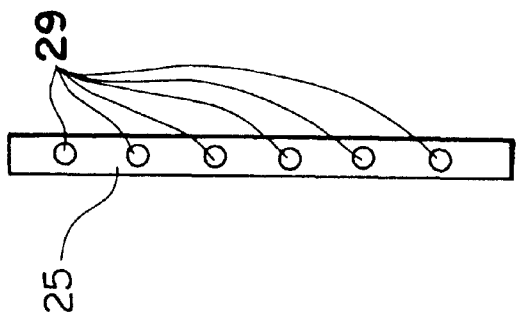
FIG. 4C is a cross sectional view taken along the line 4C—4C in FIG. 4A.
Figure 4A:
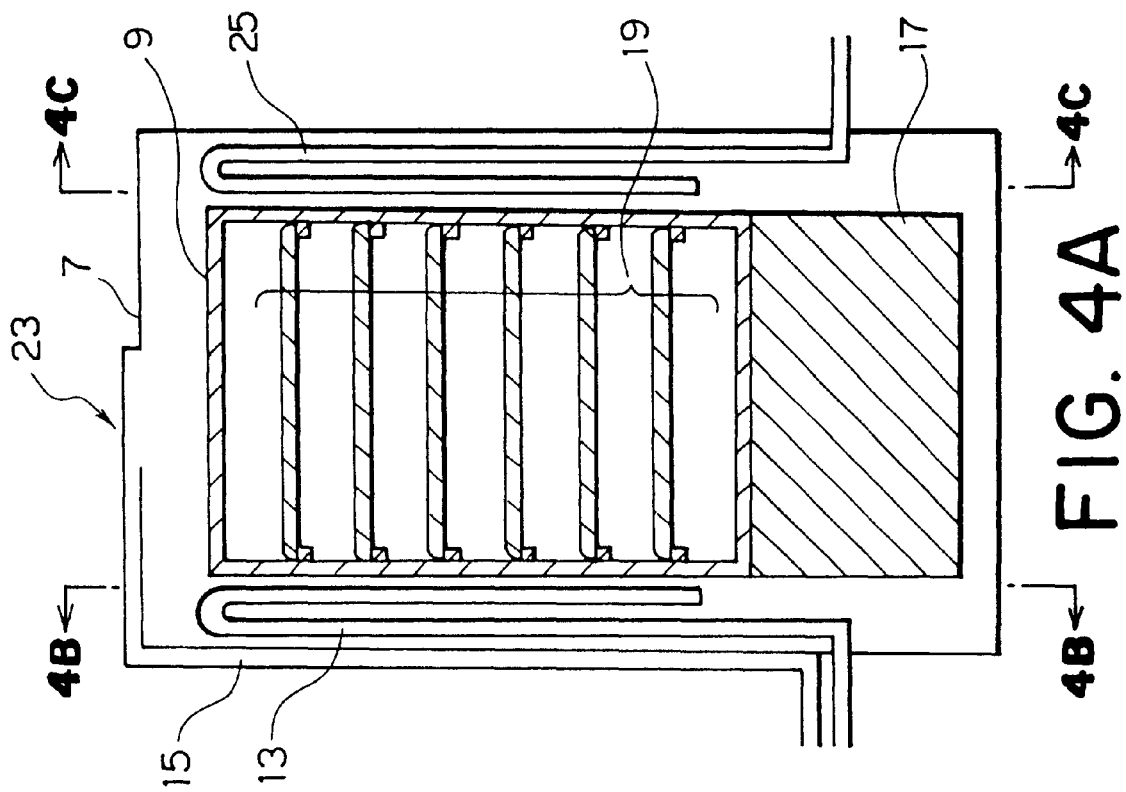
FIG. 4A is a cross sectional view taken along the line 4A—4A in FIG. 3.
Figure 4B:
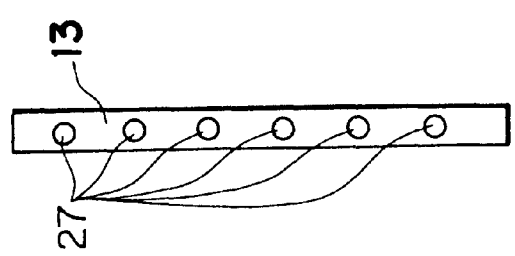
FIG. 4B is a cross sectional view taken along the line 4B—4B in FIG. 4A.

As shown in FIG. 4B and FIG. 4C, the injector pipes 13 and 25 have a plurality of gas blowing holes 27 and 29. Actually, the diameter of the injector pipes 13 and 25, and their configurations and number of the blowing holes 27 and 29 are identical with each other. The blowing holes 27 and 29 are positioned so as to spout a gas onto the surface of the substrate 19. The blowing holes 27 and 29 are so constructed as to spout the supplied gas parallel to the surface of the substrate 19 toward the center of the substrate 19 (see FIGS. 4A, 4B and 4C).

The injector pipes 13 and 25 enter the furnace core pipe 9 at a position at the bottom-half of the furnace core pipe 9, and then the injector pipes 13 and 25 travel upward in an elongated manner to a position at a top-half of the furnace core pipe 9. The injector pipes 13 and 25 have a U-shaped bend at their respective top-most positions, and then the injector pipes 13 and 25 travel downward in an elongated manner from the position at the top-half to a position at the bottom-half of the furnace core pipe 9. Each of the injector pipes 13 and 25 serves as a gas heating member in order to heat the gas supplied from these pipes 13 and 25 at the same temperature as in the furnace core pipe 9.

In the present invention, a glass plate can be used for the substrate 19 in place of a Si wafer. The substrate may not be limited to these, as far as a thin film can be formed on a surface thereof.

For forming a thin film using the apparatus for forming thin films according to the examples of the present invention, a purge gas, usually nitrogen gas, is supplied to the furnace core pipe 9 through the purge gas supply pipe 15 to purge the furnace core pipe 9. Then, a process gas is supplied to the substrate 19 via the process gas injector pipe 13. An inert gas or nitrogen gas is supplied onto the substrate 19 via the inert gas injector pipe 25 simultaneously with the process gas while allowing the substrate 19 to rotate at a rotation speed of 1 to 5 rpm by the rotation mechanism of the substrate supporting boat 11.

The flow rate of the inert gas or the nitrogen gas is controlled of with a mass flow controller (not shown in the figure). The mass flow controller comprises a gas supply control member which is provided at the inlet of the gas injector pipes 13 and 25. The gas injector pipes 13 and 25 are situated at outside of the furnace core pipe 9.

Preferably, the inert gas or the nitrogen gas is supplied with the same flow rate as that of the process gas at a process temperature of 700 to 1000° C. The blowing rate from the blowing holes 27 is adjusted to 100 to 6000 cc/min. While the gas supply rate to be controlled is practically determined by the process temperature and by a characteristic equation, details of the procedure is omitted herein.

Figure 5:
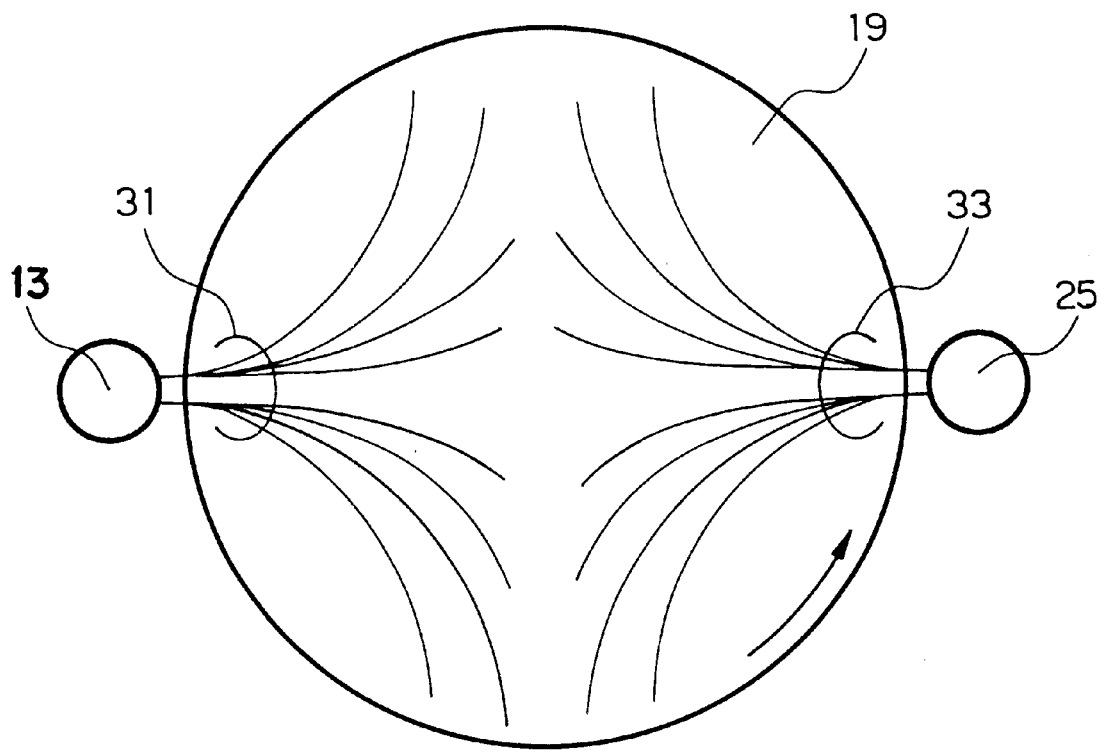
FIG. 5 is a cross sectional view taken along the line 5—5 in FIG. 3.

Referring to FIG. 5, the inert gas injector pipe 25 has the same configuration as the process gas injector pipe 13 and is disposed at the opposite side of the latter pipe 13 relative to the center of the substrate 19. The process gas and the inert gas or the nitrogen gas are supplied preferably with the same flow rate as the flow rate of the process gas at the process temperature by the use of the process injector pipe 13 and the inert gas injector pipe 25.

At the center of the substrate 19, the process gas is diluted in concentration with the inert gas or the nitrogen gas by the procedure described above. The process gas flow spreads along the direction indicated by an arrow 31 at the circumference of the substrate 19, which is increased by taking advantage of the resistance caused by the inert gas or nitrogen gas flow indicated by an arrow 33. The former function of the inert gas or the nitrogen gas serves for reducing the film thickness at the center of the substrate 19. The latter of the inert gas or the nitrogen gas serves, on the other hand, for increasing the film thickness at the circumference of the substrate 19. Uniformity of the film thickness of the film on the substrate can be improved by these two functions of the inert gas or nitrogen gas.

Now descriptions will be made as regards embodiments for forming a thin film using the apparatus for forming thin films according to the examples of the present invention.

EXAMPLE 1

In example 1, a phosphosilicate glass is formed on the substrate 19 as a diffusion layer using the vertical type diffusion furnace. The apparatus for forming thin films is the same constitution as shown in FIGS. 3 and 4A, 4B and 4C. The inner diameters of the injector pipes 13 and 25 were 5 mm. The blowing holes 27 and 29 assume a circle with a diameter of 0.1 mm. The number of the blowing holes was 100 that was the same as the plate number of the substrate 19. The substrate supporting boat 11 is rotated at the rotation speed of 6 rpm. Through the same numbers of the blowing holes 27 and 29 as the plate number of the substrates were used in this example, they should not necessarily be the same with each other. The pressure in the furnace is always kept at one atmosphere.

An 8-inch Si wafer was used for the substrate 19 while a mixed gas of a phosphorous compound ($POCl_3$), oxygen and nitrogen was used for the process gas. The gas supplied throughout the inert gas injector pipe 25 was nitrogen.

The gases were supplied at a process temperature during diffusion of 850° C. with a feed rate of the blowing gas at 850° C. of 3000 cc/min for 40 minutes.

The result showed that a film of phosphosilicate glass having a mean film thickness of 20 $\mu$m with a good uniformity of the film thickness was formed on the Si wafer. The film thickness was measured at each nine points on the substrate and uniformity of the film was judged by the proportion (%) of the difference between the maximum and minimum film thickness to the mean film thickness. The phosphosilicate glass obtained in Example 1 was improved in uniformity of the thickness by 1.5% as compared with the value of 3% obtained in the conventional art in which no nitrogen gas was supplied.

EXAMPLE 2

A Si oxide film was formed using the same apparatus in Example 1 while an oxidative gas was used as a process gas instead of the phosphorous compound. An 8-inch silicon (Si) wafer was used for the substrate 19 and steam was used for the oxidative gas. Nitrogen gas was used as a feed gas from the inert gas injector pipe 25. The gas was supplied at a process temperature of 950° C. with a gas blow rate at 950° C. of 3000 cc/min for 8 minutes. The interior of the furnace was always kept at an atmospheric pressure. Consequently, a silicon (Si) oxide film with a good uniformity with a thickness of 20 nm was obtained.

Although the examples in which a diffusion layer film or an oxide film was formed using the vertical type diffusion furnace as an apparatus for forming thin films were hitherto described in detail, the kind of the heat treatment device and films are by no means limited to the descriptions set forth herein.

As hitherto described, the inert gas injector pipe capable of spouting an inert gas or nitrogen gas was provided so that the gas confronts the process gas spouted from the conventional process gas injector in the apparatus for forming thin films according to the present invention. By simultaneously using the two kind of gases, it is made possible to form thin films on the substrate with uniform film thickness.

In the preferred embodiment of the present invention, only one pair of the inert gas injector pipe 25 and the process gas injector pipe 13 are provided in the furnace core pipe 9. However, a plurality of pairs of the inert gas injector pipe 25 and the process gas injector pipe 13 can be provided in different positions on a concentric circle in the furnace core pipe 9 as far as the process gas can be made uniform on a surface of the substrate, such as the Si wafer.

What is claimed is:

1. A method of producing a thin film on a substrate disposed in a furnace core pipe, which comprises a step of making the substrate to rotate around a center axis thereof while allowing a first gas to spout toward the substrate in a direction substantially perpendicular to said center axis, said center axis being a normal line passing through a center of one principal face of the substrate, said first gas consisting essentially of a process gas, wherein the thin film is formed on the substrate while allowing a second gas to spout in a colliding direction with respect to the first gas, the second gas consisting essentially of an inert gas, wherein the first gas is simultaneously supplied with the second gas.

2. A method according to claim 1, wherein approximately a same amount of said first gas and said second gas are supplied.

3. A method according to claim 2, wherein said first gas and said second gas are supplied at an approximately same flow speed with each other.

4. A method according to claim 2, wherein said first gas comprises a component that forms a phosphosilicate glass film as a reaction product after a reaction.

5. A method according to claim 2, wherein said first gas comprises a component that forms a silicon oxide film after a reaction.

6. A method according to claim 2, wherein the substrate consists essentially of a glass substrate or a silicon wafer and has a surface on which said thin film is formed comprises a glass surface.

7. A method according to claim 1, wherein the first gas enters the furnace core pipe at a first position at a lower-half of the furnace core pipe, travels upwards in a first pipe to a second position at an upper-half of the furnace core pipe, and then travels back down in the first pipe to third position at the lower-half of the furnace core pipe, wherein the first pipe has an inverted-U shape when disposed in the furnace core pipe.

8. A method according to claim 7, wherein the second gas enters the furnace core pipe at a fourth position opposite the first position at the lower-half of the furnace core pipe, travels upwards in a second pipe to a fifth position at the upper-half of the furnace core pipe, and then travels back down in the second pipe to a sixth position at the lower-half of the furnace core pipe, wherein the second pipe has the inverted-U shape when disposed in the furnace core pipe.

9. A method according to claim 8, wherein the first and fourth positions are approximately equivalent positions with respect to a vertical axis of the furnace core pipe, wherein the second and fifth positions are approximately equivalent positions with respect to the vertical axis of the furnace core pipe, and wherein the third and sixth positions are approximately equivalent positions with respect to the vertical axis of the furnace core pipe.

10. The method as claimed in claim 1, wherein the first gas and second gas are supplied at an approximately equal temperature.

11. The method as claimed in claim 1, wherein the second gas is supplied at a temperature above approximately 700° C. and below approximately 1000° C.

12. The method as claimed in claim 1, wherein the first and second gas are supplied at an approximately equal flow rate.

13. The method as claimed in claim 1, wherein the second gas does not react with the substrate.

14. The method as claimed in claim 1, wherein the second gas does not react with the first gas.

15. The method as claimed in claim 10, wherein the first and second gas are supplied at an approximately equal flow rate, and wherein, as a result of the first and second gases being supplied at an approximately equal temperature and flow rate, the thin film is formed having a substantially uniform thickness at a central portion and at a circumferential portion of the substrate.

* * * * *